June 28, 1966 R. B. BROWN III, ET AL 3,258,695
REFLEX RECEIVER
Filed March 18, 1963
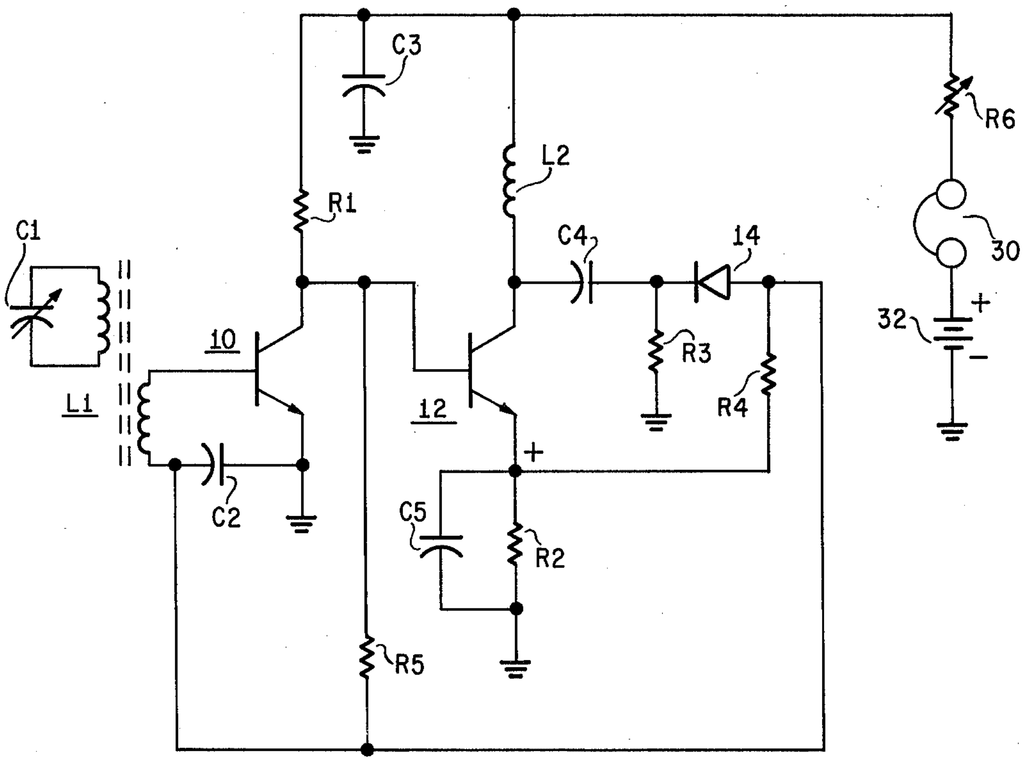
INVENTORS:
RICHARD B. BROWN, III
KEVIN R. DALY
BY Spencer E. Olson
ATTORNEY United States Patent Office 3,258,695

Patented June 28, 1966

3,258,695

REFLEX RECEIVER

Richard B. Brown III, Bedford, and Kevin R. Daly, Stoughton, Mass., assignors to Sylvania Electric Products Inc., a corporation of Delaware Filed Mar. 18, 1963, Ser. No. 265,859
6 Claims. (Cl. 325—486)

The present invention relates to radio receivers and more particularly to receivers incorporating reflex amplifier circuits.

Reflex circuits, wherein signals of different frequency ranges are simultaneously amplified, are well known in the art and are widely used, particularly in low cost transistor radios. Presently known reflex circuits generally provide reflex action over a single stage, one common means being to employ the transistor as a second IF amplifier and also as a first audio stage. Additional stages are usually needed to provide sufficient amplification to energize an output transducer. Heretofore, the reflex stage has been transformer coupled to the preceding and succeeding stages in the receiver, the transformers being incorporated in appropriately tuned circuits in order to couple the signals to their respective signal utilization means. While these presently known circuits are suitable for some purposes, they require a greater number of components than can be tolerated for many applications. In the art of microminiature circuits for example, it is desirable and necessary to construct circuits having the least number of components possible to perform the intended circuit function. In addition, the components should lend themselves to microminiaturization. Transformers, which are required in conventional reflex circuits, cannot be made in a size comparable to that of microcircuits, and in addition cannot be formed directly in a microcircuit. Accordingly, it is an object of the present invention to provide a reflex circuit which is adaptable to microminiaturization.

Another object of the invention is to provide a reflex circuit which requires no transformers.

Another object of the invention is to provide a circuit having a reflex action over two stages.

Still another object of the invention is to provide a reflex circuit which requires a minimum number of components.

A further object of the invention is to provide a radio receiver having only three active elements.

Briefly, the invention comprises a receiver having two direct coupled transistors which provide two stages of RF amplification and also two stages of audio amplification. The two stages of RF amplification provide improved sensitivity while the two audio stages provide sufficient audio gain to drive an earphone. The RF output from the second stage is detected by a diode detector, the output of which is fed back to the input of the two transistor stages which then act as audio amplifiers. The audio output from the second stage drives an earphone or other suitable output device. The equivalent of four amplifier stages are therefore provided by two transistors operating in a reflex circuit having reflex action over two stages.

The foregoing, together with other objects, features and advantages of the present invention will become more apparent from the following detailed description, taken in conjunction with the drawing, the single figure of which is a schematic diagram of a reflex receiver in accordance with the invention.

The circuit shown in the drawing is a tuned RF receiver and is adaptable for use in the AM broadcast band, as well as other bands such as the 300–500 kc. navigation band, or the 2–3 mc. marine band, for example. In fact, the receiver, apart from the tuned input circuit, is capable of operation over a rather broad frequency range. Typically, the receiver can operate from approximately 300 kc. to 30 mc., depending of course on the particular antenna circuit used. The tuned input circuit consists of a variable capacitor C1 in parallel with the input coil of a ferrite antenna L1. Tuning is accomplished by adjusting the capacitor C1 to obtain the desired resonant frequency. The ferrite slug is adjusted, in the well known manner, in relation to the antenna coils to obtain the desired tuning range. Transistors 10 and 12 function as two direct-coupled cascaded RF amplifiers, and also as two direct-coupled cascaded audio amplifiers. Although NPN transistors are shown in the illustrated embodiment, PNP transistors can be substituted, with changes in the polarity of the operating potential accordingly. A resistor R1 and an inductor L2 provide collector loads for transistors 10 and 12, respectively. The capacitors C2, C3, and C5, which have low impedance at RF frequencies, are RF by-pass capacitors. The inductor L2 has a low impedance at audio frequencies to direct the audio signal to the audio load. A suitable operating potential is provided by a battery 32 connected in series with an earphone 30 to ground.

In operation, an RF signal from the antenna circuit is applied to the base of transistor 10, and is amplified by transistors 10 and 12. The amplified signal appears at the collector of transistor 12, and is applied via a capacitor C4 to a diode detector 14. The diode is suitably forward biased by a voltage divider network consisting of R3 and R4. The bias potential is developed across R2. The audio load for the detector is provided by the series combination of R2 and R4. The bias is so chosen that the diode operates near the knee of its characteristic curve in order to provide improved small signal sensitivity and reduced distortion. The demodulated signal thus produced contains both audio signals and a direct current component which is useful to provide automatic gain control. The audio signal is fed back through the secondary coil of antenna L1, which has a low impedance at audio frequencies, to the base of transistor 10. The capacitor C2 has a high impedance at audio frequencies; therefore, the audio signal appears across it between the base and emitter of transistor 10. Automatic gain control is provided by the direct current component of the detector output which is fed back to the base of transistor 10 through the secondary of the antenna L1, and also to the base of transistor 12 through resistor R5. There being no RF feedback, A.C. gain is maximized for a given AGC bias. Also, a large amount of RF gain ahead of the diode detector allows improved The audio signal which has been fed back to the base small signal sensitivity and reduced detector distortion. of transistor 10 is now amplified and coupled from collector of transistor 12 through inductor L2 to the audio load which consists of a volume control potentiometer R6 and an earphone 30. At audio frequencies, the capacitor C4 appears as a high impedance, while inductor L2 appears as a low impedance, thus directing the audio signal to the audio load rather than to the detector.

Direct current feedback, developed across resistor R2, is fed back through resistor R4 and the secondary coil of antenna L1 to bias the base of transistor 10 in a forward direction, thereby improving the temperature operating point stability. Degenerative A.C. feedback to control distortion and stabilize the A.C. gain is provided around transistor 10 via resistor R5 and the secondary of L1, and around transistor 12 by means of resistor R1 and inductor L2.

It is evident that the circuit requires a minimum number of components to perform the intended function, and, significantly, without the need for transformers. For this reason, the circuit is particularly suited to incorporation in a microminiature circuit. In the microcircuit art, circuit components, and interconnections therefor, are formed directly on a dielectric substrate. The transistors and diode can be incorporated into the circuit by conventional soldering techniques, or can be grown directly on the substrate in the manner taught in copending application S.N. 161,992, filed December 26, 1961, and assigned to the assignee of the present application. Since there are no transformers, the entire circuit, with the exception of the ferrite antenna, battery, earphone and volume control potentiometer, can be fabricated on a micro-wafer.

A microminiature broadcast receiver has been built in accordance with the invention on a one inch square wafer, with the component values given in Table I.

*Table I*

| | | |
|---|---|---|
| R1 | ohms | 2,000 |
| R2 | ohms | 750 |
| R3, R4 | ohms | 12,000 |
| R5 | ohms | 10,000 |
| R6 | ohms (potentiometer) | 10,000 |
| C1 | microfarads | 30–365 |
| C2 | microfarads | 0.05 |
| C3 | microfarads | 0.02 |
| C4 | picofarads | 150 |
| C5 | microfarads | 10 |
| L2 | microhenries | 120 |
| Transistors **10, 12** | | 2N706 |

The circuit operates on a 4.5 volt battery and draws only one milliampere of current, thus insuring extremely long battery life. The measured audio frequency response of the receiver is from 20 c.p.s. to 15 kc.; however, the audio frequency response is limited by the earphone to a range of 50 c.p.s. to 4 kc. In order to take advantage of the full fidelity of the receiver, it could be used to drive a power amplifier which, in turn, would drive a loudspeaker.

While there has been described what is now considered to be a preferred embodiment of the invention, many modifications and changes will occur to those skilled in the art without departing from the true spirit and scope of the invention. Accordingly, it is not intended to limit the invention by what has been particularly shown or described, except as indicated in the appended claims.

What is claimed is:

1. A reflex amplifier circuit comprising, a first transistor having an emitter, a collector, and a base; radio frequency coupling means connected to the base-emitter circuit of said first transistor, a second transistor having an emitter, a collector, and a base, a direct connection between the collector of said first transistor and the base of said second transistor; a detector, radio frequency coupling means connected between the collector of said second transistor and said detector, audio frequency coupling means for coupling the output of said detector to the base of said first transistor; an audio frequency load, and audio frequency coupling means connecting the collector of said second transistor through said load to a source of operating potential.

2. A reflex amplifier circuit in accordance with claim 1 wherein said detector is a semiconductor diode.

3. A reflex amplifier circuit in accordance with claim 2 wherein said radio frequency coupling means connected between the collector of said second transistor and said detector is a capacitor having a low impedance at radio frequencies and a high impedance at audio frequencies.

4. A reflex receiver circuit comprising, first and second transistors each having an emitter, a collector, and a base, a direct connection from the collector of said first transistor to the base of said second transistor, a tunable circuit for intercepting radio frequency signals comprising a ferrite rod antenna having input and output coils and a variable capacitor in parallel with said input coil, means connecting the output coil of said antenna to the base-emitter circuit of said first transistor, a detector for demodulating said radio frequency signals, radio frequency coupling means coupling the collector of said second transistor to said detector, audio frequency coupling means for coupling the output of said detector to the base of said first transistor, said audio frequency coupling means also providing a path for application of an automatic gain control signal, an audio frequency load, audio frequency coupling means connected between the collector of said second transistor and said audio frequency load, first alternating current feedback means connecting the collector of said first transistor to the base of said first transistor, second alternating current feedback means connecting the collector of said second transistor to the base of said second transistor, and direct current feedback means connecting the emitter of said second transistor to the base of said first transistor.

5. A reflex amplifier circuit comprising, first and second transistors each having an emitter, a collector, and a base, a direct connection between the collector of said first transistor and the base of said second transistor, radio frequency coupling means for applying received modulated radio frequency signals to the base-emitter circuit of said first transistor, a detector, radio frequency coupling means coupling the collector of said second transistor to said detector, audio frequency coupling means coupling the output of said detector to the base-emitter circuit of said first transistor, and audio frequency coupling means coupling the collector of said second transistor to signal utilization means.

6. A reflex amplifier circuit comprising, first and second transistors each having an emitter, a collector, and a base, direct connection between the collector of said first transistor and the base of said second transistor, means for applying a modulated carrier signal to the base-emitter circuit of said first transistor, a diode detector for producing a demodulated signal from said carrier signal, means presenting low impedance to said carrier signal coupling the collector of said second transistor to said detector, demodulated signal coupling means connecting the output of said detector to the base-emitter circuit of said first transistor, and coupling means presenting a high impedance at carrier frequencies and a low impedance a demodulated signal frequencies coupling the collector of said second transitor to a load.

No references cited.

KATHLEEN H. CLAFF, *Primary Examiner.*

R. LINN, *Assistant Examiner.*